United States Patent
Jensen et al.

(10) Patent No.: US 7,057,261 B2
(45) Date of Patent: Jun. 6, 2006

(54) MIXED LVR AND HVR RETICLE SET DESIGN FOR THE PROCESSING OF GATE ARRAYS, EMBEDDED ARRAYS AND RAPID CHIP PRODUCTS

(75) Inventors: John Jensen, Portland, OR (US); Robert Muller, Portland, OR (US); Mark Simmons, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/053,505

(22) Filed: Feb. 8, 2005

(65) Prior Publication Data

US 2005/0147913 A1   Jul. 7, 2005

Related U.S. Application Data

(62) Division of application No. 10/699,276, filed on Oct. 31, 2003, now Pat. No. 6,900,075.

(51) Int. Cl.
*H01L 23/544* (2006.01)
*H01L 29/94* (2006.01)
*H01L 31/62* (2006.01)
*H01L 31/113* (2006.01)
*H01L 31/119* (2006.01)

(52) U.S. Cl. .......................... 257/620; 257/288

(58) Field of Classification Search ................ 257/620, 257/288
See application file for complete search history.

(56) References Cited

U.S. PATENT DOCUMENTS 6,232,051 B1    5/2001   Suzuki
6,410,353 B1 *  6/2002   Tsai ........................... 257/288

\* cited by examiner

*Primary Examiner*—Cuong Nguyen
(74) *Attorney, Agent, or Firm*—Trexler, Bushnell, Giangiorgi, Blackstone & Marr, LTD

(57) ABSTRACT

An embodiment of the present invention provides a novel method which makes LVR to HVR registration possible by wrapping the X and Y scribes around each instance of each layer on both the LVR and HVR reticles; standard HVR reticles and LVR reticles will not align to one another due to registration and electrical test structures in the scribe being in different locations. Another embodiment of the present invention addresses the loss of die per wafer due to increased scribe area when using LVR and HVR reticles in the same set.

8 Claims, 9 Drawing Sheets

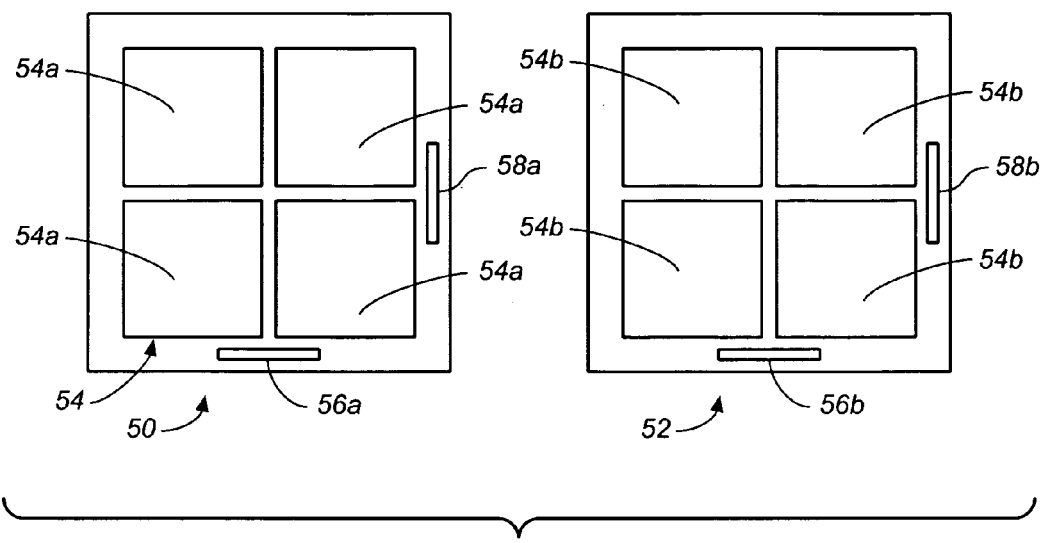
FIG. 1 *(PRIOR ART)*
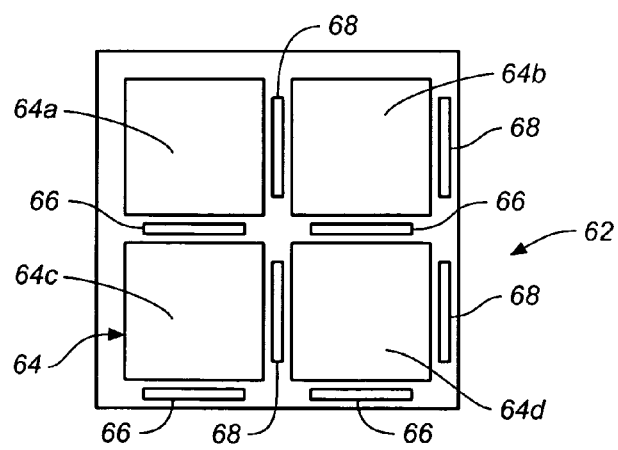
FIG. 4 *(PRIOR ART)*

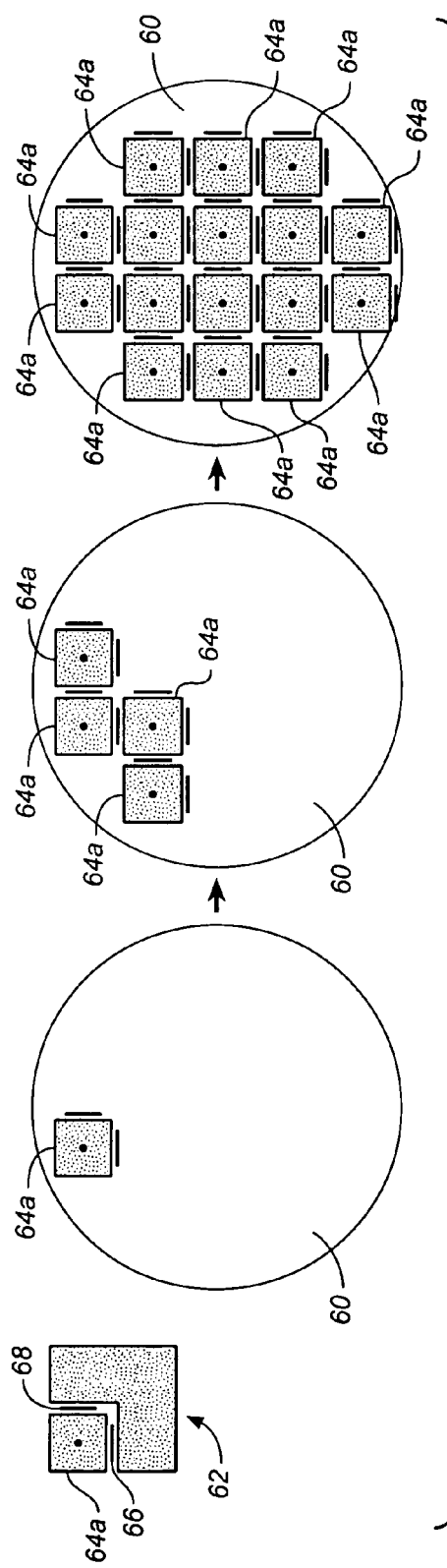
FIG. 5 *(PRIOR ART)*
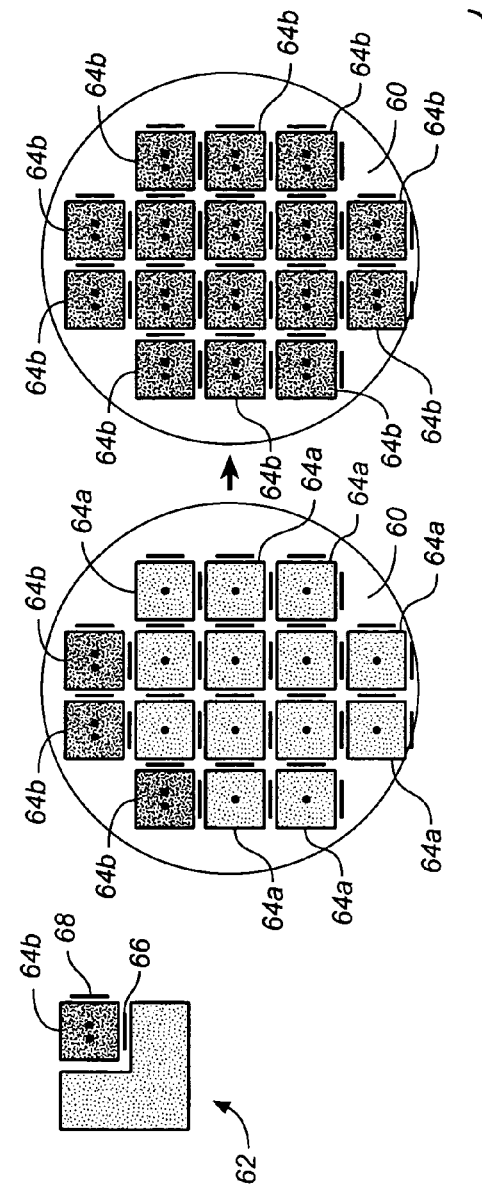
FIG. 6 *(PRIOR ART)*

MIXED LVR AND HVR RETICLE SET DESIGN FOR THE PROCESSING OF GATE ARRAYS, EMBEDDED ARRAYS AND RAPID CHIP PRODUCTS

CROSS-REFERENCE

This patent application is a divisional of U.S. patent application Ser. No. 10/699,276, filed on Oct. 31, 2003, now U.S. Pat. No. 6,900,075, and entitled "Mixed LVR and HVR Reticle Set Design for the Processing of Gate Arrays, Embedded Arrays and Rapid Chip Products".

BACKGROUND OF THE INVENTION

The present invention generally relates to the mixture of Low Volume Reticles (LVRs) with High Volume Reticles (HVRs) for the processing of gate arrays, embedded arrays and rapid chip products.

A number of problems have been identified in the fields of reticle technology, photolithography and array-based ASICS. One such problem is the need for high volume production of master device templates that can be customized into several low volume products using customer specific reticles. Another problem is the need for Low Volume, customer specific, Reticles (LVRs) which consist of multiple device layers on a single reticle to be used concurrently in production with High Volume Reticles (HVRs) which consist of multiple instances of a single device layer on a reticle. Still another problem is the need for a pattern of the LVRs to register to the HVRs when printed on the wafer. Conversely, another problem is the need for a pattern of the HVRs to register to the LVRs when printed on the wafer. Yet another problem is the decrease in die per wafer due to wrapping a scribe around each die for both LVRs and HVRs for registration and end of line testing. Still another problem is the high cost of standard HVR sets relative to an LVR set custom order. Another problem is the prototype turnaround time of wafer processing associated with full LVR sets.

There are two known existing solutions to these problems, namely, using a full set of LVRs or using a full set of HVRs, without mixing HVR and LVR in a single set. There are deficiencies, however, with both of these solutions.

Traditional device manufacturing makes use of HVRs that consist of multiple instances of a single layer each reticle in the set. FIG. 1 shows a first HVR reticle 50 and a second HVR reticle 52. The first HVR reticle 50 has an array of die of a first layer data 54a. The array of die of the first layer data 54a is formed in a square pattern, in this case in a 2×2 array. An X scribe 56a is positioned below the first layer data 54a and a Y scribe 58a is positioned to the right of the first layer data 54a. Similarly, the second HVR reticle 52 has an array of die of a second layer data 54b. The second layer data 54b is formed in a square pattern identical to that of the first layer data 54a. An X scribe 56b is positioned below the second layer data 54b and a Y scribe 58b is positioned to the right of the second layer data 54b.

The first layer data 54a is repeated in multiple instances on each reticle 50, such that when printing to the wafer 60, as illustrated in FIG. 2, multiple chips are made per exposure.

The X scribes 56a, 56b and the Y scribes 58a, 58b are used for registration when exposing the reticle 52 to the wafer 60. As illustrated in FIG. 3, the first layer data 54a was first exposed on the wafer 60. The X scribe 56b of the second layer data 54b then aligns to the X scribe 56a of the first layer data 54a, and the Y scribe 58b of the second layer data 54b then aligns to the Y scribe 58a of the first layer data 54a around each exposure and to create scribeline devices for electrical testing at sort.

This method of using a full set of HVRs provides for high speed manufacturing since multiple instances of the devices are exposed simultaneously on the wafer 60. However, it requires that one reticle be created for each layer of the device. This method makes small customer orders economically unfeasible due to the high cost of a reticle set for a device which consists of many layers.

The other method of using a full set of LVRs also has its problems. The traditional LVR approach makes use of reticles which have multiple device layers, greatly reducing the size of the reticle set. An LVR reticle 62 is illustrated in FIG. 4. The LVR reticle 62 has a first layer data 64a, a second layer data 64b, a third layer data 64c, and a fourth layer data 64d. Each layer data 64a, 64b, 64c, 64d has an X scribe 66 positioned therebelow and a Y scribe 68 positioned to the right thereof.

Rather than expose the whole reticle field, the stepper file blades off all but one region or layer data 64a, 64b, 64c, 64d of the reticle 62 and one layer data is printed at a time, as illustrated in FIG. 5. A second region or layer data 64a, 64b, 64c, 64d of the reticle 62 is then used to print the next layer of the device, as illustrated in FIG. 6.

The method of using a full set of LVRs reduces reticle costs which makes it ideal for small scale custom orders. However, the production time increases significantly due to only exposing one instance of a layer at a time. For large scale production, this method is lacking because of the high cycle time impact.

OBJECTS AND SUMMARY OF THE INVENTION

A primary object of an embodiment of the present invention is to provide a novel approach which makes LVR to HVR registration possible.

Another primary object of an embodiment of the present invention is to provide a novel approach which addresses the loss of die per wafer due to increased scribe area when using LVR and HVR reticles in the same set.

An object of an embodiment of the present invention is to provide for the high volume production of a master device templates that can be customized into several low volume products using customer specific reticles.

Another object of an embodiment of the present invention is to provide for Low Volume, customer specific, Reticles (LVRs) which consist of multiple device layers on a single reticle to be used concurrently in production with High Volume Reticles (HVRs) which consist of multiple instances of a single device layer on a reticle.

Yet another object of an embodiment of the present invention is to provide for a pattern of LVR reticles to register to HVR reticles when printed on the wafer.

Still another object of an embodiment of the present invention is to provide for a pattern of HVR reticles to register to LVR reticles when printed on the wafer.

Another object of an embodiment of the present invention is to provide for the decrease in die per wafer due to wrapping a scribe around each die for both LVR and HVR reticles for registration and end of line testing.

Yet another object of an embodiment of the present invention is to provide for the high cost of standard (HVR) reticle sets relative to a low volume custom order.

Another object of an embodiment of the present invention is to reduce the prototype turnaround time of wafer processing associated with full LVR reticle sets.

Briefly, and in accordance with at least one of the foregoing objects, an embodiment of the present invention provides a novel method which makes LVR to HVR registration possible by wrapping the X and Y scribes around each instance of each layer on both the LVR and HVR reticles; standard HVR reticles and LVR reticles will not align to one another due to registration and electrical test structures in the scribe being in different locations. Another embodiment of the present invention addresses the loss of die per wafer due to increased scribe area when using LVR and HVR reticles in the same set.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 illustrates a pair of HVR reticles used in traditional, prior art, device manufacturing;

FIG. 4 illustrates an LVR reticle used in traditional, prior art, device manufacturing;

FIG. 5 illustrates one of the layer datas of the LVR reticle of FIG. 4 being printed multiple times on a wafer;

FIG. 6 illustrates another one of the layer datas of the LVR reticle of FIG. 4 being printed multiple times on the wafer;

DESCRIPTION

Figure 2:
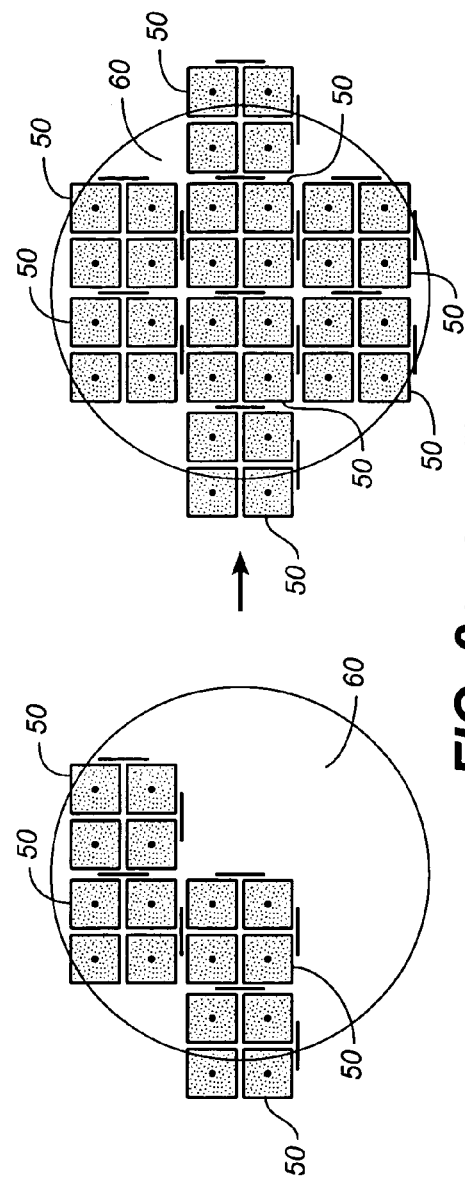
FIG. 2 illustrates one of the HVR reticles of FIG. 1 being printed multiple times on a wafer.
Figure 3:
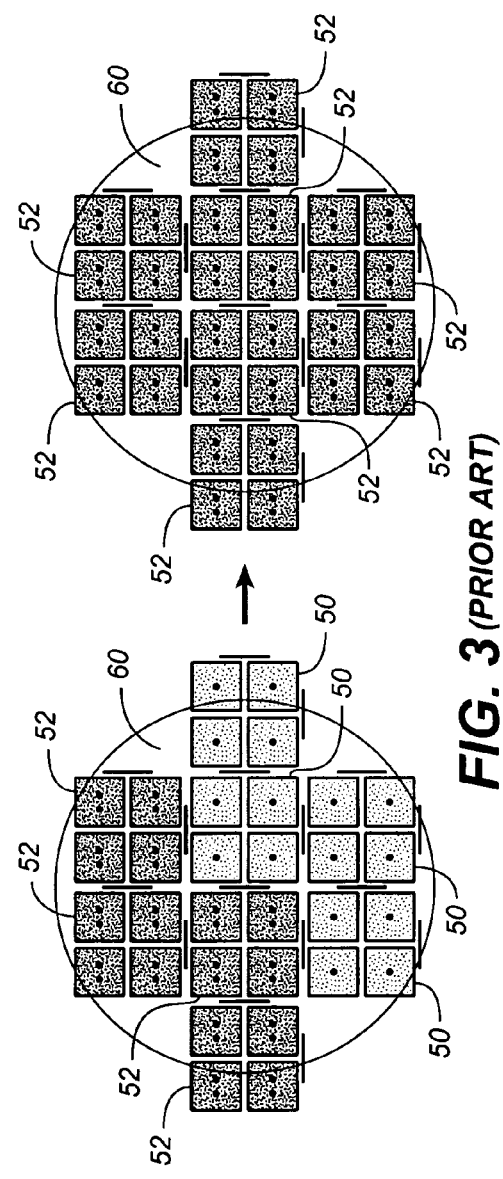
FIG. 3 illustrates the other one of the HVR reticles of FIG. 1 being printed multiple times on the wafer.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

The invention focuses on the process for Array-Based ASIC manufacturing in which both high volume production and small custom orders are relevant. Array-Based ASICs offer the fastest customized implementation of a customer's logic onto a piece of silicon because of the small number of reticles required to define the function of the chip. Diffusion layers are completed in large scale production. HVR reticles are best used for this process, as described hereinabove. These wafers then sit in inventory waiting for the personalization provided by the customer. Most Gate Array Product/Rapid Chip families will have several "masterslice" sizes available to allow for some reasonable selection of die size that comes closest to the size needed to implement customer logic. The front end of the diffusion "template wafers" will always contain more gates than will be used to implement the custom design simply because they have been built as general purpose pre-constructed pieces of silicon, specifically so that turn around time can be fast, since only the top few layers of metal must be processed to complete a design definition. This concept is ideal for designs that will either have relatively low production volume or for designs that may need to be redone because of design changes or enhancements. Since the custom orders will generally be small, the LVR reticle method lends itself well to the back end "custom" processing. Thus, for optimal production of Gate Array, Embedded Array, and Rapid Chip products, a method was needed in which LVR and HVR reticles could be used concurrently in the same set to build custom products. Large scale production of standard diffusion layers can be done with HVR reticles in which multiple instances of the device are exposed at a time. Then, for the configurable customer specific layers, LVR reticles are used to customize the back end of the devices.

A standard HVR reticle 50 is illustrated in FIG. 1. The HVR reticle 50 is formed by first laying down an array of die 54, which is in a single layer of identical dies 54*a*. The array of die 54 is formed in a square pattern, in the illustrated embodiment the square pattern is 2×2. Provided below the array of die 54, is an X scribe 56*a* which is wrapped around the array of die 54. Provided to the right of the array of die 54, is a Y scribe 58*a* which is wrapped around the array of die 54.

A standard LVR reticle 62 is illustrated in FIG. 4. The LVR reticle 62 is formed by first laying down an array of die 64, which is formed of multiple layers of different dies 64*a*, 64*b*, 64*c*, 64*d*. The array of die 64 is formed in a square pattern, in the illustrated embodiment the square pattern is 2×2. Provided below each die 64*a*, 64*b*, 64*c*, 64*d*, is an X scribe 66 which are wrapped around the dies 64*a*, 64*b*, 64*c*, 64*d*. Provided to the right of each die 64*a*, 64*b*, 64*c*, 64*d*, is a Y scribe 68 which are wrapped around the dies 64*a*, 64*b*, 64*c*, 64*d*.

It should be noted that when exposing the LVR reticle 62, only one of the dies 64*a*, 64*b*, 64*c*, 64*d*, for instance die 64*a*, is printed at a time. The other dies 64*b*, 64*c*, 64*d* are bladed out by the stepper.

Figure 7:
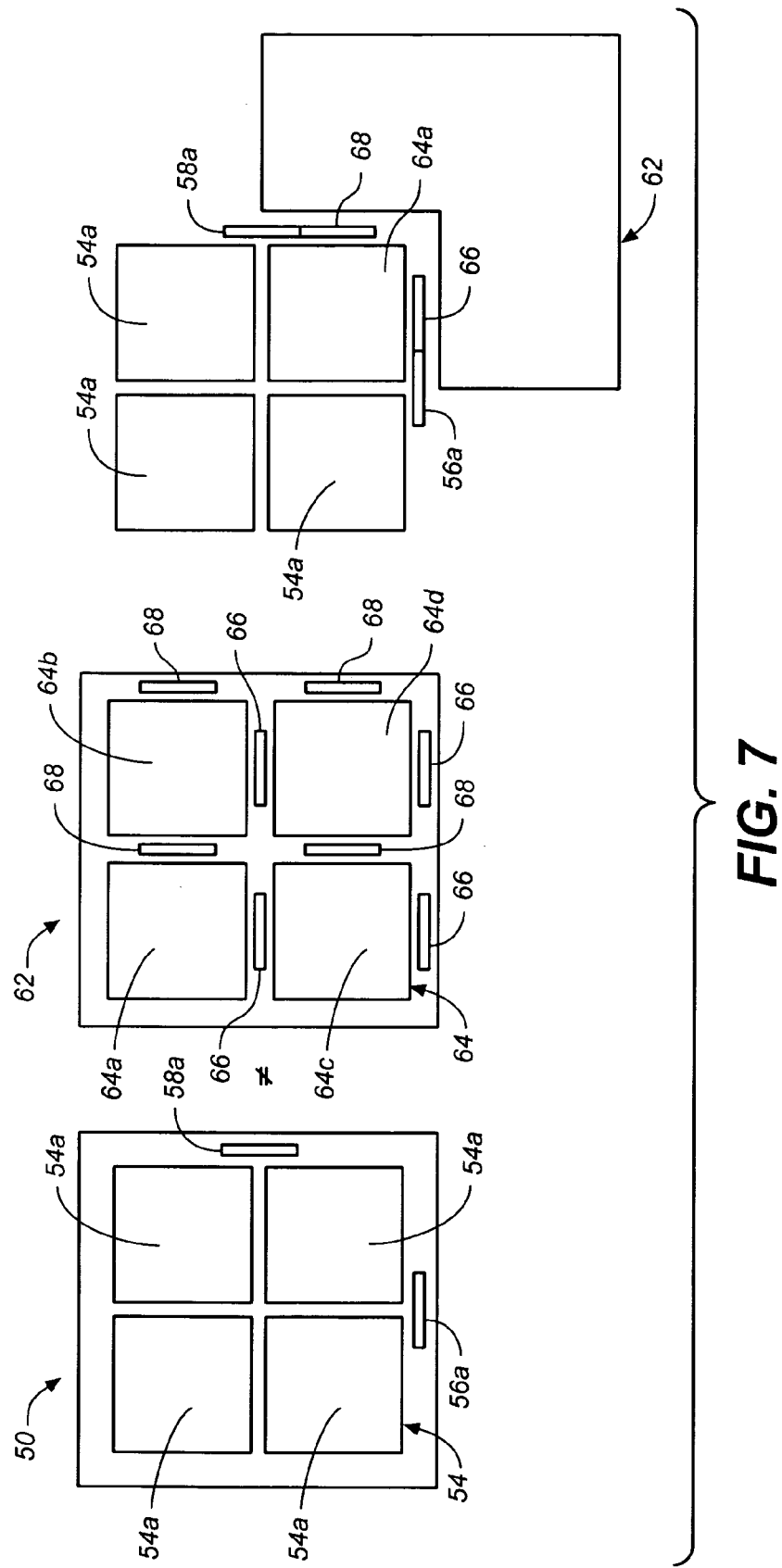
FIG. 7 illustrates the misalignment of the LVR reticle illustrated in FIG. 4 with the HVR reticle illustrated in FIG. 1.

Thus, the standard HVR reticle 50 and the standard LVR reticle 62 will not align to one another due to registration and electrical test structures in the X scribe 56*a* of the HVR reticle 50 and the X scribe 66 of the LVR reticle 62 being in different locations, and due to registration and electrical test structures in the Y scribe 58*a* of the HVR reticle 50 and the Y scribe 68 of the LVR reticle 62 being in different locations, as illustrated in FIG. 7. This is a critical problem since for a Rapid Chip type model, it is desirable to have the ability to mix reticles and have high volume front end production, and LVR back end production.

Figure 8:
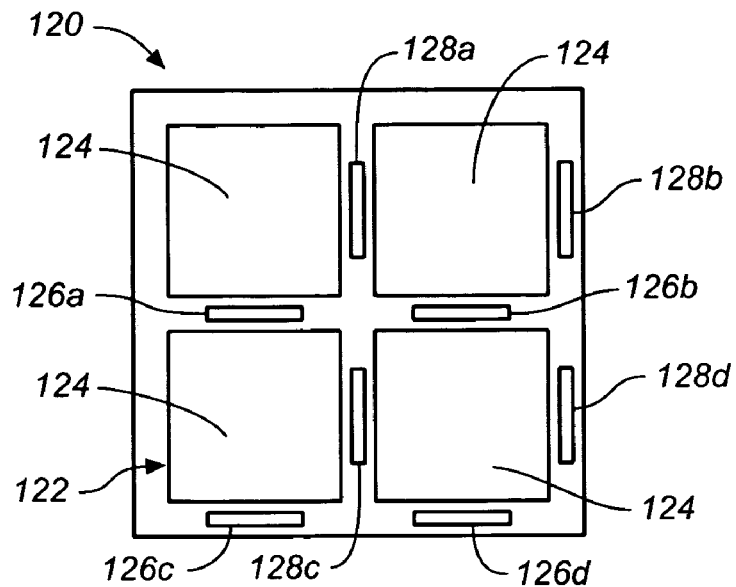
FIG. 8 illustrates an HVR reticle which is configured for alignment and registration with the LVR reticle illustrated in FIG. 4.

In order to overcome this problem, a modified HVR reticle 120 is provided. Like the HVR reticle 50, the modified HVR reticle 120 is formed by first laying down an array of die 122, which is in a single layer of identical dies 124. The array of die 122 is formed in a square pattern, in the illustrated embodiment the square pattern is 2×2. The modified HVR reticle 120, though, is then provided with a plurality of X scribes 126a, 126b, 126c, 126d which are positioned below each of the identical dies 124. The modified HVR reticle 120 is also then provided with a plurality of Y scribes 128a, 128b, 128c, 128d which are positioned to the right of each of the identical dies 124. The modified HVR reticle 120 is illustrated in FIG. 8. Thus, the X scribes 126a, 126b, 126c, 126d of the modified HVR reticle 120 can be aligned with the X scribes 66 of the standard LVR reticle 62. Similarly, the Y scribes 128a, 128b, 128c, 128d of the modified HVR reticle 120 can be aligned with the Y scribes 68 of the standard LVR reticle 62.

Figure 9:
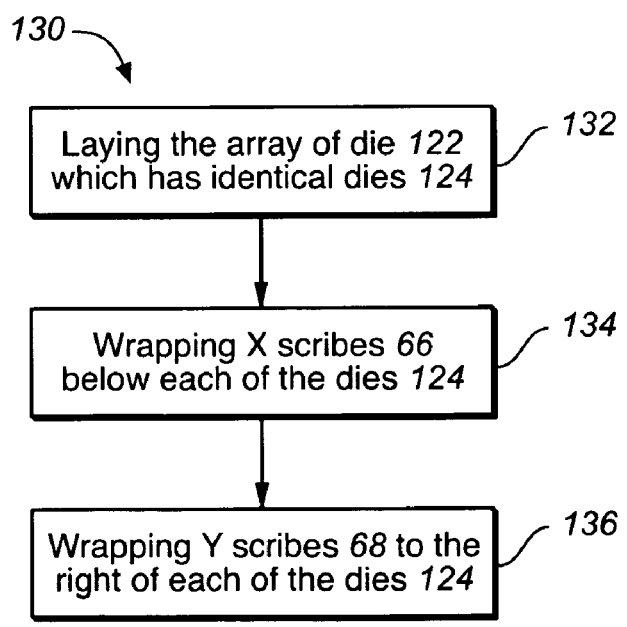
FIG. 9 illustrates a flow chart of a method of forming the HVR reticle of FIG. 8.

A method 130 of forming the modified HVR reticle 120 includes the step 132 of laying the array of die 122 which has identical dies 124, the step 134 of wrapping X scribes 66 below each of the dies 124, and wrapping Y scribes 68 to the right of each of the dies 124, as illustrated in FIG. 9.

Figure 10:
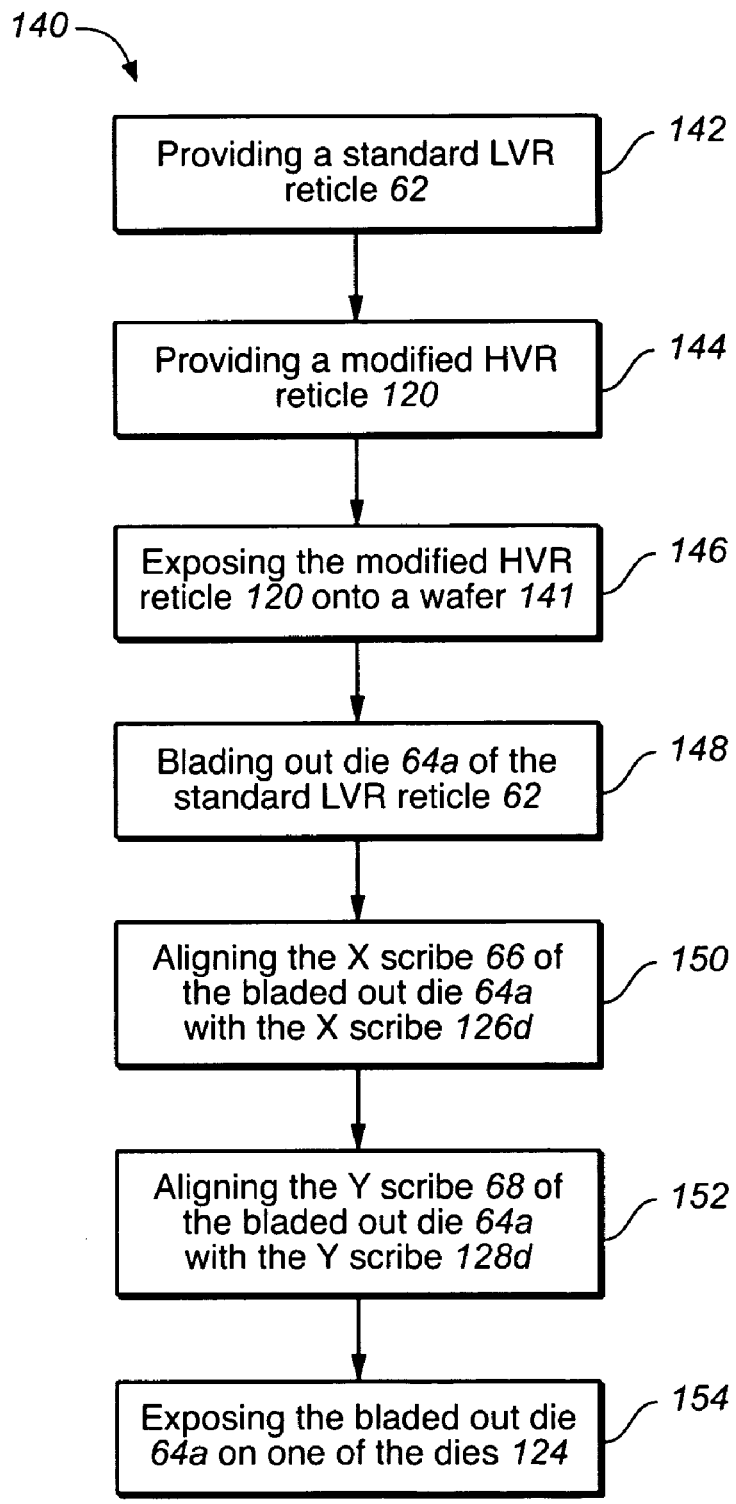
FIG. 10 illustrates a flow chart of a method of preparing a wafer using the HVR reticle of FIG. 8 and the LVR reticle of FIG. 4.

A method 140 of the invention is provided, and is illustrated in FIG. 10. The method 140 is a method of preparing a wafer 141 using the modified HVR reticle 120 and the LVR reticle 62. The method 140 begins with the step 142 of providing a standard LVR reticle 62, similar to that as illustrated in FIG. 4. The method 140 further begins with the step 144 of providing the modified HVR reticle 120, as illustrated in FIG. 8. The method 140 includes the step 146 of exposing the modified HVR reticle 120 onto the wafer 141. The method 140 includes the step 148 of blading out one of the dies 64a, 64b, 64c, 64d of the standard LVR reticle 62, for illustration purposes die 64a is bladed out. The method 140 further includes the step 150 of aligning the X scribe 66 of the bladed out die 64a with one of the X scribes 126a, 126b, 126c, 126d of the modified HVR reticle 120, for illustration purposes X scribe 66 is aligned with X scribe 126d. The method 140 further includes the step 152 of aligning the Y scribe 68 of the bladed out die 64a with one of the Y scribes 128a, 128b, 128c, 128d of the modified HVR reticle 120, for illustration purposes Y scribe 68 is aligned with Y scribe 128d. The method 140 further includes the step 154 of exposing the bladed out die 64a on one of the dies 124 of the modified HVR reticle 120. In similar fashion, the bladed out die 64a can be exposed on the other dies 124 of the modified HVR reticle 120 as desired. Also in similar fashion, the other dies 64b, 64c, 64d of the standard LVR reticle 62 can be bladed out and exposed on the dies 124 of the modified HVR reticle 120 as desired.

The method 140 provides for high volume production of base layers with HVR reticles which can then be set to inventory. From those base layer wafers, only a small number of LVR reticles need to be created to create a customer specific product. From a customer perspective, prototype turnaround time is thus decreased with respect to traditional methods. Designs that require a complete mask set (cell-based) will always require more time to manufacture than designs which use a basic set of diffusion masks and only require customization at the metal layers (Array-Based).

The method 140 while advantageous over the full HVR approach and the full LVR approach of the prior art, is lacking in that the overall scribe area is greatly increased which directly lowers the density of die that can be printed on the wafer. Thus, LVR to HVR registration is accomplished at the cost of yield through less die per wafer.

Traditionally, Array-Based technologies focus on fast implementation of logic integration onto a single chip, rather than on absolute highest density. Full HVR (cell-based) designs allow for more logic onto a chip in a given area. Since a scribe must be wrapped around each instance on the reticle for registration of LVR reticles, valuable wafer real-estate is taken up by the repetition of scribe structures. Thus, full HVR designs use silicon more efficiently than LVR-HVR mixed reticle sets. Shown below is a wafer using the afore-mentioned method of wrapping a scribe around each die versus a standard HVR wafer in which there is an X and Y scribe for every (4) die (the actual number of die on a HVR reticle is dictated by die size). The die on the HVR wafer can be packed tighter resulting in more die per wafer.

Figure 11:
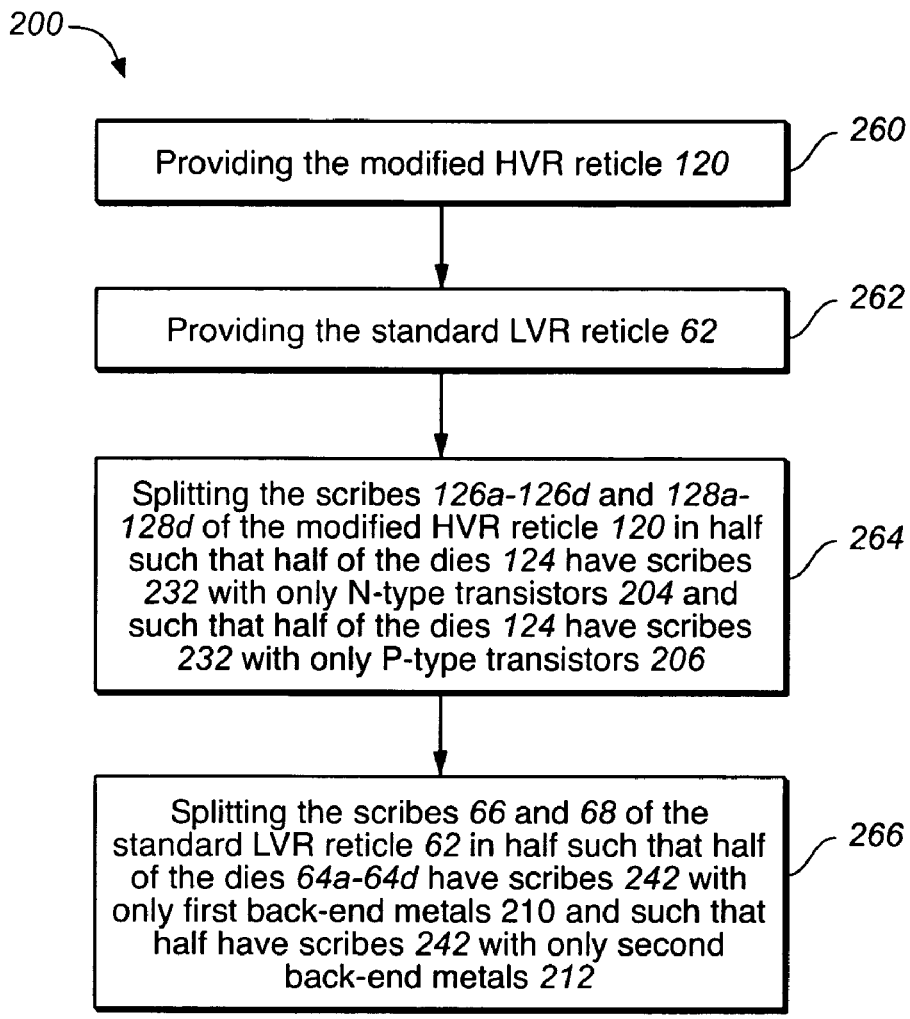
FIG. 11 illustrates a flow chart of a method of forming the HVR reticle of FIG. 16 and the LVR reticle of FIG. 17.

A method 200 is thus described and illustrated in FIG. 11, to overcome this problem. The method 200 is aimed at reducing the scribe width in order to pack die more efficiently on the wafer. In a traditional scribe there are structures used for registration and structures used for electrical testing of the finished product. Registration marks are needed around each die for LVR to HVR alignment, however, the scribeline transistors related to wafer testing are not necessary around every die. There are multiple types of transistors in the scribe and their physical properties are defined in the diffusion (HVR) layers of processing. Even though the functionality of these structures are different, the metal back end layers (processed with LVR reticles) are identical for these transistors. The method 200 is directed at scribes having P and N type transistors therein. It should be noted, however, that the method 200 applies to any scribeline structures of which functionality is defined in HVR masking layers and share common patterns on LVR masking layers.

Figures 12, 13:
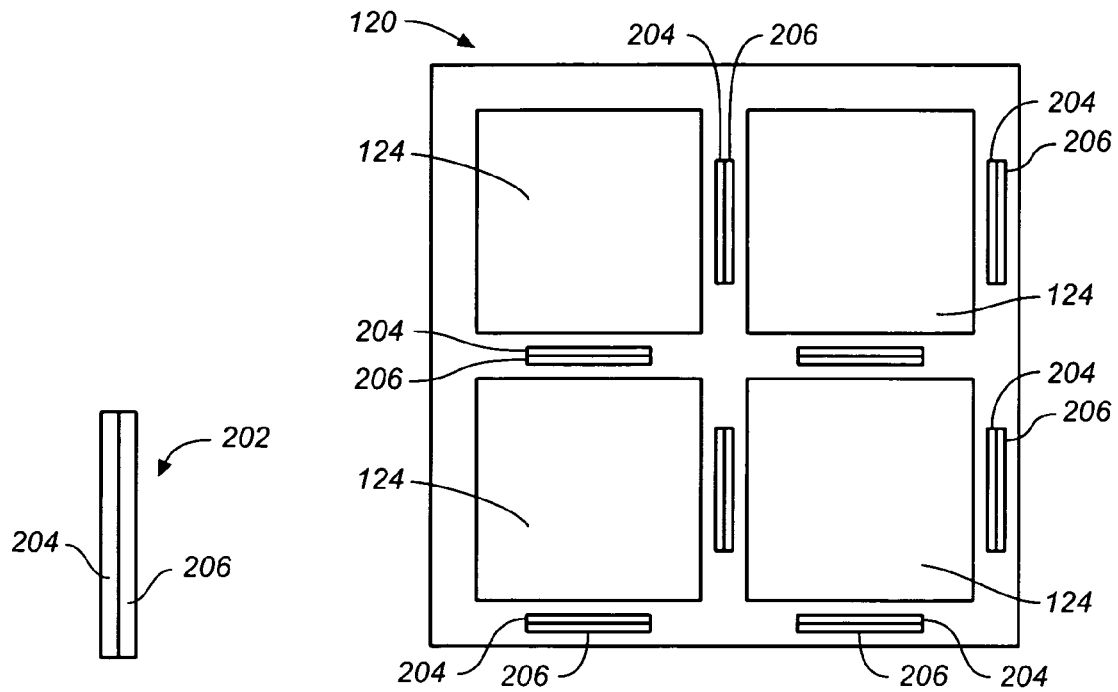
FIG. 12 illustrates a traditional front-end scribe having an N-type transistor and a P-type transistor aligned in columns side-by-side.
FIG. 13 illustrates the HVR reticle of FIG. 8 having the traditional front-end scribes of FIG. 12.
Figures 14, 15:
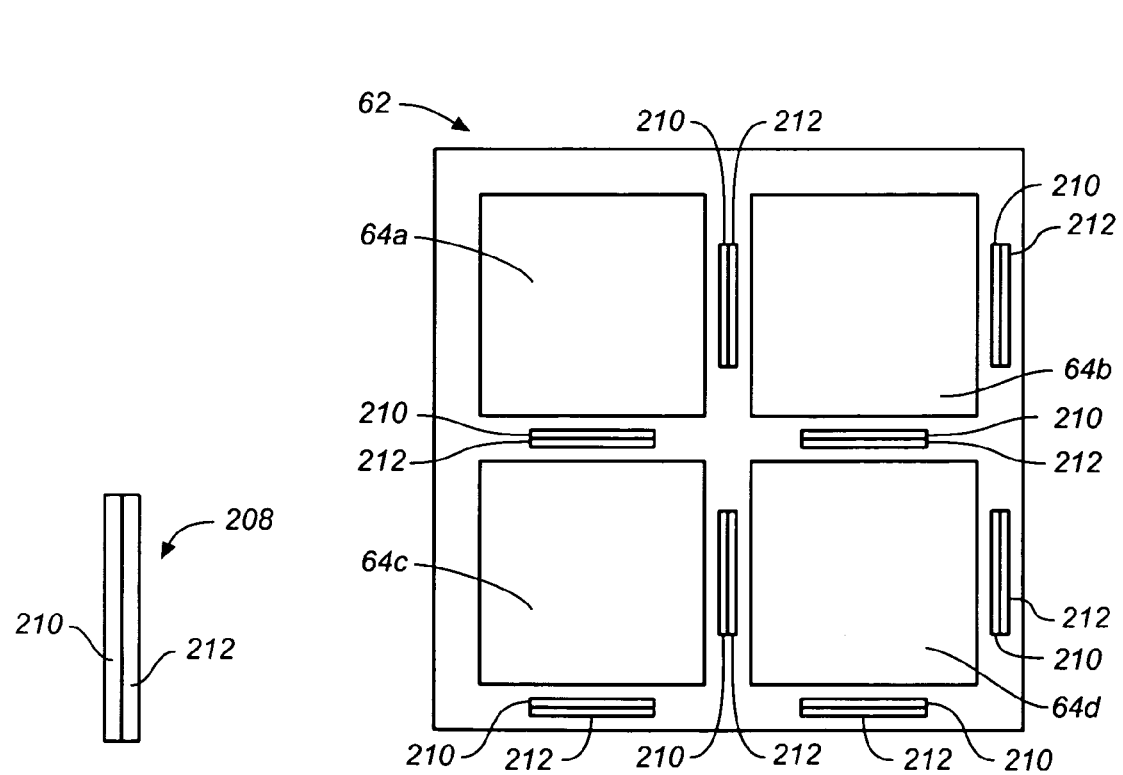
FIG. 14 illustrates a traditional back-end scribe having a first back-end metal and a second back-end metal aligned in columns side-by-side.
FIG. 15 illustrates the LVR reticle of FIG. 4 having the traditional back-end scribes of FIG. 14.

Traditional front-end scribes 202 have N transistors 204 and P transistors 206 which are aligned in columns side by side, as illustrated in FIG. 12. These scribes 202 can be positioned in the modified HVR reticle 120, as illustrated in FIG. 13. Traditional back-end scribes 208 have a first back end metal 210 and a second back end metal 212 which are aligned in columns side by side, as illustrated in FIG. 14. These scribes 208 can be positioned in the traditional LVR reticle 62, as illustrated in FIG. 15.

Figure 16:
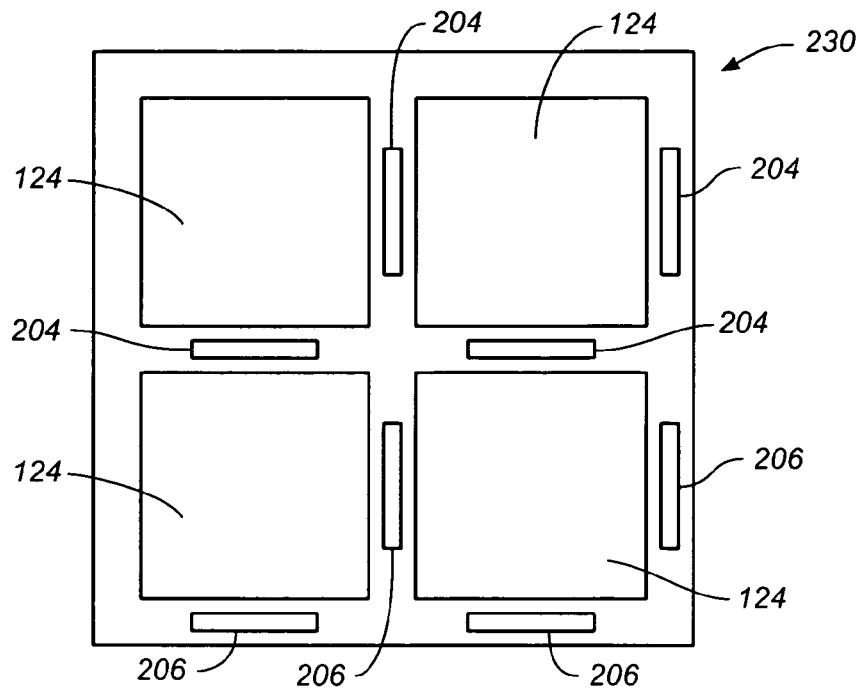
FIG. 16 illustrates the HVR reticle formed by the method of FIG. 11.
Figure 17:
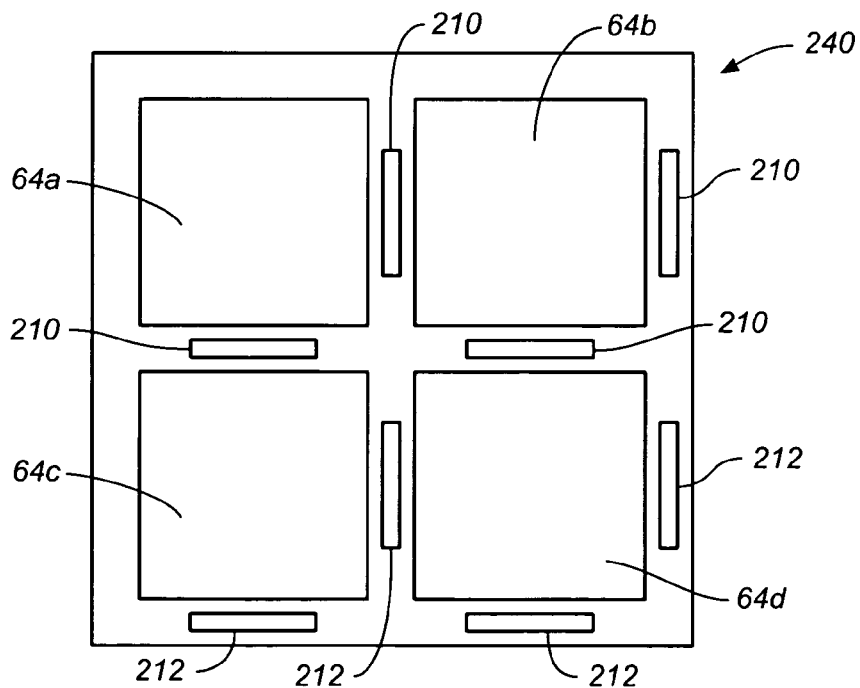
FIG. 17 illustrates the LVR reticle formed by the method of FIG. 11.

The scribeline transistors are used at end of line testing to determine wafer characteristics. Thus, a number of both N and P transistors 204, 206 are required for sampling across the wafer 141, but not necessary on every die 124. Since a scribe 202 with both N and P transistors 204, 206 around each die 124 creates redundancy and takes up valuable silicon, the structures from the front end layers can be split. This decreases the overall area of the scribe region. The metal pattern on the back end LVR reticles is repeated for the N and P type transistors and can also be split. This results in new thin scribes for both types of reticles. Thus, an HVR reticle 230 having thin scribes 232 is illustrated in FIG. 16. The HVR reticle 230 is identical to the HVR reticle 120, except that the HVR reticle 230 has scribes 232 which are split in half. Some of the scribes 232 have only P type transistors 206 while some of the scribes 232 have only N type transistors 204. Similarly, an LVR reticle 240 having thin scribes 242 is illustrated in FIG. 17. The LVR reticle 240 is identical to the LVR reticle 62, except that the LVR reticle 240 has scribes 242 which are split in half. Some of the scribes 232 have only first back end metals 210 while some of the scribes 242 have only second back end metals 212.

The result of the split scribe is increased die per wafer due to tighter packing of layer instances on the reticle. The scribe width decreases due to splitting the structures between die. Now half the die on the wafer will have P type scribeline transistors 206 while the other half will have N type 204, rather than each die having both P and N type in its scribe.

Thus, the method 200 includes the step 260 of providing the modified HVR reticle 120. The method 200 includes the step 262 of providing the traditional LVR reticle 110. The method 200 includes the step 264 of splitting the scribes 126a–126d, 128a–128d of the modified HVR reticle 120 in half such that half of the dies 124 of the modified HVR reticle 120 have scribes 232 with only N type transistors 204 and such that half of the dies 124 of the modified HVR reticle 120 have scribes 232 with only P type transistors 206. The method 200 further includes the step 266 of splitting the scribes 66, 68 of the traditional LVR reticle 62 in half such that half of the dies 64a–64d of the traditional LVR reticle 62 have scribes 242 with only first back end metals 210 and such that half of the dies 64a–64d of the traditional LVR reticle 62 have scribes 242 with only second back end metals 212. The method 200 is then identical to the method 140 above, with respect to steps 146, 148, 150, 152 and 154, except that the scribes 232, 242 of the HVR and LVR reticles 230, 240 take up less area than the scribes 126a–126d, 128a–128d, 66, 68 of the HVR and LVR reticles 120, 62 of method 140, because the scribes 232, 242 have been split in half.

Thus, the resultant dies on the wafer 141 formed from using the methods 140 and 200 are more densely packed than the resultant dies on the wafer 141 formed from using the methods 130 and 140. However, the increase in die per wafer is proportional to both the number of instances of die on the reticle and the die size. The more die per reticle for smaller the die size, the greater the benefit from the reduced scribe approach. The example provided was generally for P and N transistors, but the method 200 can be extended to any scribeline structures which have their electrical parameters defined on the slice HVR layers and share common back end stacks on the LVR layers.

While an embodiment of the present invention is shown and described, it is envisioned that those skilled in the art may devise various modifications of the present invention without departing from the spirit and scope of the appended claims.

What is claimed is:

1. An HVR reticle which is configured for registration with an LVR reticle, said HVR reticle comprising:
   an array of die wherein each die of said array is generally identical to said other dies of said array of dies; and
   a plurality of scribes which are wrapped around each of said dies of said array of die, wherein each die of said array has a separate set of scribes wrapped therearound wherein each set of scribes is different, thereby providing that the HVR reticle is configured for registration with an LVR reticle.

2. An HVR reticle as defined in claim 1, wherein said array of die is in a two by two formation.

3. An HVR reticle as defined in claim 1, wherein said plurality of scribes includes a plurality of X scribes and a plurality of Y scribes.

4. An HVR reticle as defined in claim 3, wherein each said X scribe positioned below each said die of said array of die.

5. An HVR reticle as defined in claim 3, wherein each said Y scribe is positioned to the right of each said die of said array of die.

6. An HVR reticle as defined in claim 1, wherein each said scribe includes an N-type transistor or a P-type transistor.

7. An HVR reticle as defined in claim 1, wherein each said scribe includes an N-type transistor, but does not include a P-type transistor.

8. An HVR reticle as defined in claim 1, wherein each said scribe includes a P-type transistor, but does not include an N-type transistor.

* * * * *